United States Patent
Oh et al.

(10) Patent No.: US 7,208,791 B2
(45) Date of Patent: *Apr. 24, 2007

(54) INTEGRATED CIRCUIT DEVICES INCLUDING A CAPACITOR

(75) Inventors: Byung-jun Oh, Yongin (KR); Kyung-tae Lee, Gwacheon (KR); Mu-kyeng Jung, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/168,126

(22) Filed: Jun. 28, 2005

(65) Prior Publication Data

US 2005/0247968 A1    Nov. 10, 2005

Related U.S. Application Data

(63) Continuation of application No. 10/657,490, filed on Sep. 8, 2003, now Pat. No. 6,940,114.

(30) Foreign Application Priority Data

Dec. 11, 2002  (KR) ............................ 2002-0078905

(51) Int. Cl.
H01L 27/108   (2006.01)
(52) U.S. Cl. .................. 257/306; 257/306; 257/296; 257/751
(58) Field of Classification Search ................ 257/295, 257/296, 306
See application file for complete search history.

(56) References Cited

U.S. PATENT DOCUMENTS 5,851,868 A    12/1998 Kim ............................ 438/238

(Continued)

FOREIGN PATENT DOCUMENTS

EP    1 130 654    9/2001

(Continued)

OTHER PUBLICATIONS

Notice to File Response for corresponding Korean Application No. 2002-0078905 dated Dec. 17, 2004 (English Translation).

*Primary Examiner*—Andy Huynh
*Assistant Examiner*—Thinh T Nguyen
(74) *Attorney, Agent, or Firm*—Myers Bigel Sibley & Sajovec

(57) ABSTRACT

Integrated circuit devices include an integrated circuit substrate and a conductive lower electrode layer of a capacitor on the integrated circuit substrate. A dielectric layer is on the lower electrode layer and a conductive upper electrode layer of the capacitor is on the dielectric layer. A first intermetal dielectric layer is on the upper electrode layer. The first intermetal dielectric layer includes at least one via hole extending to the upper electrode layer. A first conductive interconnection layer is on the at least one via hole of the first intermetal dielectric layer. A second intermetal dielectric layer is on the first intermetal dielectric layer. The second intermetal dielectric layer includes at least one via hole extending to the first conductive interconnection layer and at least partially exposing the at least one via hole of the first intermetal dielectric layer. A second conductive interconnection layer is provided in the at least one via hole of the second intermetal dielectric layer that electrically contacts the first conductive interconnection layer.

8 Claims, 9 Drawing Sheets

U.S. PATENT DOCUMENTS

| | | | |
|---|---|---|---|
| 6,124,199 A * | 9/2000 | Gambino et al. | 438/622 |
| 6,278,148 B1 | 8/2001 | Watanabe | 257/296 |
| 6,399,495 B1 | 6/2002 | Tseng et al. | 438/687 |
| 6,940,114 B2 * | 9/2005 | Oh et al. | 257/296 |
| 2001/0022369 A1 | 9/2001 | Fukuda et al. | 257/207 |
| 2003/0040161 A1 | 2/2003 | Schrenk et al. | 438/393 |

FOREIGN PATENT DOCUMENTS

KR   1020030037215   5/2003

* cited by examiner

INTEGRATED CIRCUIT DEVICES INCLUDING A CAPACITOR

RELATED APPLICATION

This application claims priority to and is a continuation of parent application Ser. No. 10/657,490, filed Sep. 8, 2003, now issued U.S. Pat. No. 6,940,114, which claims priority from Korean Application No. 2002-78905, filed Dec. 11, 2002 the disclosures of which are hereby incorporated herein by reference.

BACKGROUND OF THE INVENTION

The present invention relates to integrated circuit devices and, more particularly, integrated circuit devices including capacitors and methods for manufacturing such integrated circuit devices.

As the integration density of integrated circuit devices has increased, it has become more difficult to obtain a desired capacitance in a conventional Metal-Insulator-Semiconductor (MIS) capacitor, for example, due to a low k-dielectric layer formed between a dielectric layer and a silicon layer. An alternative to an MIS capacitor is a metal-insulator-metal (MIM) capacitor.

FIG. 1 is a cross-sectional diagram illustrating an integrated circuit (semiconductor) device including a conventional MIM capacitor coupled to a transistor. As shown in FIG. 1 a first transistor includes a gate 13a, a source 15, and a drain 17a formed in an integrated circuit substrate 11. A second transistor includes a gate 13b and a drain 17b formed in the integrated circuit substrate 11. The second transistor also includes the source 15.

The drain 17a of the first transistor is connected to a lower electrode 21 of a MIM capacitor via a conductive pattern 19. A dielectric layer 23 and an upper electrode 25 of the MIM capacitor are formed on the lower electrode 21. The lower electrode 21 and the upper electrode 25 are conductive metal layers. An interconnection layer 27 is formed on and connected to the upper electrode 25 of the MIM capacitor.

The drain 17b of the second transistor is connected to an upper interconnection layer 33 via the conductive pattern 19 and interconnection layers 29 and 31. While not shown in FIG. 1, the interconnection layer 27 may also be connected to the upper interconnection layer 33. Also shown in FIG. 1 are insulating layers 35, 45, 55, and 65.

One limitation on the performance of the MIM capacitor illustrated in FIG. 1 is the insufficient distance between the interconnection layer 27 and the lower electrode 21. As this distance is reduced, an undesirable level of parasitic capacitance may develop, which parasitic capacitance may adversely affect the characteristics of the MIM capacitor. Problems become more severe when the thickness of the insulating layers is reduced, because parasitic capacitance of the device is generally inversely proportional to the thickness of the insulating layer.

FIG. 2 is a graph illustrating a simulation of the influence of parasitic capacitance for different thicknesses of an insulating layer, such as the insulating layer 55. As illustrated in FIG. 2, as the thickness of the insulating layer decreases, the parasitic capacitance increases in a non-linear manner.

Thus, for a conventional integrated circuit device including a MIM capacitor as illustrated in FIG. 1, an increase in parasitic capacitance between the interconnection layer 27 and the lower electrode 21 may degrade and/or reduce the stability of the characteristics of the MIM capacitor. In addition, the variability of the parasitic capacitance based on process variables such as the thickness of an insulating layer may increase the difficulty of forming MIM capacitors with stable characteristics.

SUMMARY OF THE INVENTION

Embodiments of the present invention include integrated circuit devices including an integrated circuit substrate and a conductive lower electrode layer of a capacitor, such as a Metal-Insulator-Metal (MIM) or Metal-Insulator-Silicon (MIS) capacitor, on the integrated circuit substrate. A dielectric layer is on the lower electrode layer and a conductive upper electrode layer of the capacitor is on the dielectric layer. A first intermetal dielectric layer is on the upper electrode layer. The first intermetal dielectric layer includes at least one via hole extending to the upper electrode layer. A first conductive interconnection layer is on the at least one via hole of the first intermetal dielectric layer. A second intermetal dielectric layer is on the first intermetal dielectric layer. The second intermetal dielectric layer includes at least one via hole extending to the first conductive interconnection layer and at least partially exposing the at least one via hole of the first intermetal dielectric layer. A second conductive interconnection layer is provided in the at least one via hole of the second intermetal dielectric layer that electrically contacts the first conductive interconnection layer.

In other embodiments of the present invention, the first conductive interconnection layer is a landing pad type independent interconnection layer that connects the second conductive interconnection layer to the upper electrode. The dielectric layer may have a thickness between the lower electrode layer and the upper electrode layer greater than the thickness of the dielectric layer in other regions of the device. The lower electrode layer may contact an impurity region of the integrated circuit substrate, such as a drain of a transistor device.

In further embodiments of the present invention, the device further includes an insulating pattern of the first intermetal dielectric layer formed between the upper electrode and insulating layer(s) of the first intermetal dielectric layer. The insulating pattern may be formed only on the upper electrode. The insulating pattern between the upper electrode and the first intermetal dielectric layer may be selected from the group consisting of an oxide layer, a nitride layer, an fluorine-doped silicate glass (FSG) layer, an organo silicate glass (OSG) layer, a silicon carbide (SiC) layer and combinations thereof. The insulating pattern may be directly on the upper electrode and the second intermetal dielectric layer may be directly on the first intermetal dielectric layer.

In other embodiments of the present invention, the landing pad type independent interconnection layer is formed to a thickness of about 0.1 μm to about 2 μm. The at least one via hole of the first intermetal dielectric layer may be a plurality of via holes separated from each other and the at least one via hole of the second intermetal dielectric layer may be a plurality of via holes separated from each other. The landing pad type interconnection layer may be formed to the same height as the first intermetal dielectric layer. The first intermetal dielectric layer may include a trench having a diameter greater than a diameter of at least one of the plurality of via holes and a depth less than a depth of at least one of the plurality of via holes.

In further embodiments of the present invention, the dielectric layer has a thickness between the lower electrode layer and the upper electrode layer greater than the thickness of the dielectric layer in other regions of the device. The thickness of the dielectric layer in the other regions may be from about 0.01 μm to about 0.1 μm.

In other embodiments of the present invention, the device further includes a transistor having a source, a drain and a gate formed on the integrated circuit substrate. The lower electrode layer of the capacitor is electrically coupled to the drain of the transistor. A third conductive interconnection layer may be formed on the second intermetal dielectric layer and the first conductive interconnection layer and the second conductive interconnection layer may electrically couple the upper electrode to the third interconnection layer. The device may further include a second transistor having a drain and a gate formed on the integrated circuit substrate, the second transistor having a common source with the first transistor and the drain of the second transistor being electrically coupled to the third interconnection layer.

In further embodiments of the present invention integrated circuit memory devices and large scale integration (LSI) logic circuits are provided including an integrated circuit device having a capacitor as described above.

In other embodiments of the present invention, methods are provided of manufacturing an integrated circuit device including a capacitor. A capacitor, including a lower electrode, a dielectric layer and an upper electrode, is formed on an integrated circuit substrate. A first insulating layer is formed on the upper electrode of the capacitor. At least one via hole is formed in the first insulating layer extending to the upper electrode of the capacitor. A landing pad type independent interconnection layer is formed in the at least one via hole in the first insulating layer. A second insulating layer is formed on the first insulating layer. At least one via hole is formed in the second insulating layer extending to the first insulating layer and at least partially exposing the landing pad type independent interconnection layer. A second conductive interconnection layer is formed in the at least one via hole of the second insulating layer that electrically contacts the landing pad type independent interconnection layer. Forming the capacitor may include forming the dielectric layer to have a thickness between the upper and lower electrode greater than the thickness of the dielectric layer in other regions of the device.

Further embodiments of the present invention provide semiconductor devices including a capacitor formed on a semiconductor substrate and having a lower electrode, a dielectric layer, and an upper electrode. A first intermetal dielectric (IMD) is formed on the upper and lower electrodes of the capacitor and a first via hole is defined in the first IMD on the upper electrode of the capacitor. A landing pad type independent interconnection layer is formed in the first via hole. A second IMD is formed to have a second via hole exposing the landing pad type independent interconnection layer formed on the capacitor. An interconnection layer is formed in the second via hole to connect with the upper electrode of the capacitor.

The lower electrode of the capacitor may contact a drain formed in the semiconductor substrate. The upper electrode may be formed to completely cover the lower electrode.

In other embodiments of the present invention, the thickness of the dielectric layer formed under the upper electrode is greater than that of the dielectric layer formed at regions other than the region where the upper electrode is formed. An insulating pattern, which is formed of one of an oxide layer, a nitride layer, an FSG layer, an OSG layer, a SiC layer, or a combination thereof, may be formed on the upper electrode. The insulating pattern may not be formed in regions other than the region where the upper electrode is formed.

In further embodiments of the present invention, the first IMD includes a trench that has a diameter greater than the diameter of the first via hole and a depth that is smaller than the depth of the first via hole. The second IMD may also include a trench that has a diameter greater than the diameter of the second via hole and a depth that is smaller than the depth of the second via hole. The landing pad type independent interconnection layer may be formed to the same height as the first IMD. The landing pad type independent interconnection layer may include a plurality of interconnections that are separated from each other. The upper portion of the landing pad type independent interconnection layer may be wider than the lower portion thereof. Alternatively, the interconnection layer, which is connected to the upper electrode of the capacitor, may be formed to the same height as the second IMD.

In other embodiments of the present invention, semiconductor devices are provided including a lower electrode of a capacitor, which is formed on a semiconductor substrate and contacts an impurity region formed in the semiconductor substrate. A dielectric layer is formed on the lower electrode and an upper electrode of the capacitor is formed on the dielectric layer. An insulating pattern may be formed on the upper electrode of the capacitor. A first IMD is formed on the insulating pattern and a first via hole is defined in the first IMD in the region of the upper electrode. A landing pad type independent interconnection layer is formed in the first via hole. A second IMD is formed with a second via hole that exposes the landing pad type independent interconnection layer formed on the capacitor. An interconnection layer is formed in the second via hole that connects with the upper electrode of the capacitor.

In further embodiments of the present invention semiconductor devices are provided including a lower electrode of a capacitor formed on a semiconductor substrate and contacting an impurity region formed in the semiconductor substrate. A dielectric layer is formed on the semiconductor substrate including the lower electrode. The thickness of the dielectric layer formed on the lower electrode is greater than that of the dielectric layer formed at regions other than the region where the lower electrode is formed. An upper electrode of the capacitor is formed at the region where the dielectric layer is thick. An insulating pattern is formed on the upper electrode of the capacitor. A first IMD is formed on the insulating pattern and a first via hole is defined in the first IMD on the upper electrode of the capacitor. A landing pad type independent interconnection layer is formed in the first via hole. A second IMD is formed to have a second via hole exposing the landing pad type independent interconnection layer formed on the capacitor. An interconnection layer is formed in the second via hole to connect with the upper electrode via the landing pad type independent interconnection layer.

In other embodiments of the present invention, semiconductor devices are provided including a lower electrode of a capacitor formed on a semiconductor substrate and contacting an impurity region formed in the semiconductor substrate. A dielectric layer is formed on the semiconductor substrate including the lower electrode and includes regions having thicknesses different from each other. A thick portion of the dielectric layer is disposed on the lower electrode of the capacitor. An upper electrode of the capacitor is formed to completely cover the lower electrode of the capacitor. An insulating pattern is formed only on the upper electrode of the capacitor. A first IMD is formed on the insulating pattern and a plurality of first via holes are defined in the first IMD on the insulating pattern. A plurality of landing pad type independent interconnection layers are formed in the first via hole. A second IMD is formed to have a plurality of via holes exposing the plurality of landing pad type independent interconnection layers formed on the capacitor. An interconnection layer is formed in the plurality of via holes to connect with the upper electrode of the capacitor via the plurality of landing pad type independent interconnection layers.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
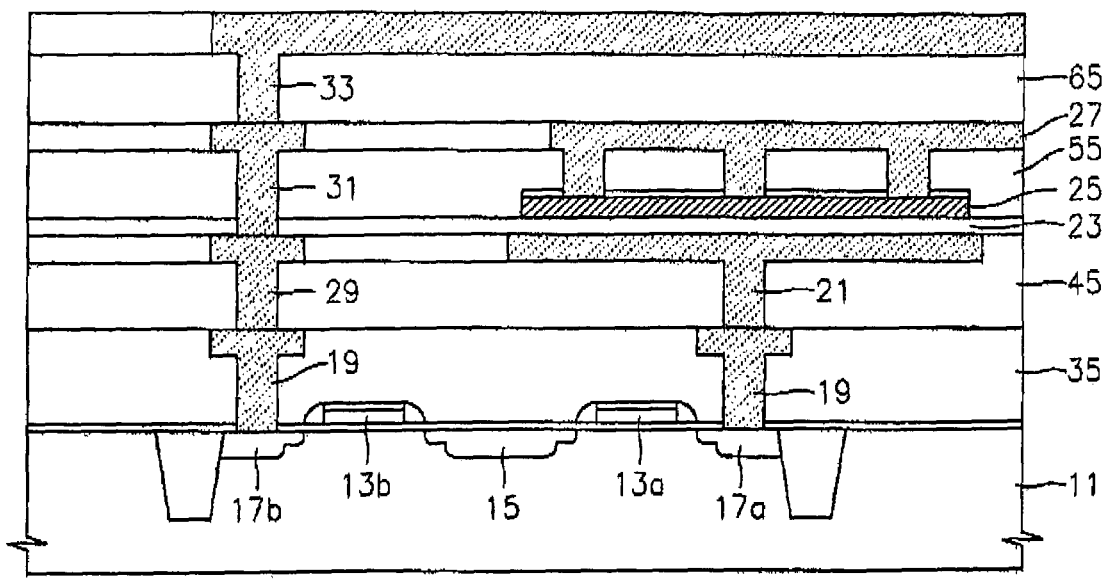
FIG. 1 is a cross-sectional diagram illustrating an integrated circuit device including a MIM capacitor according to the prior art.
Figure 2:
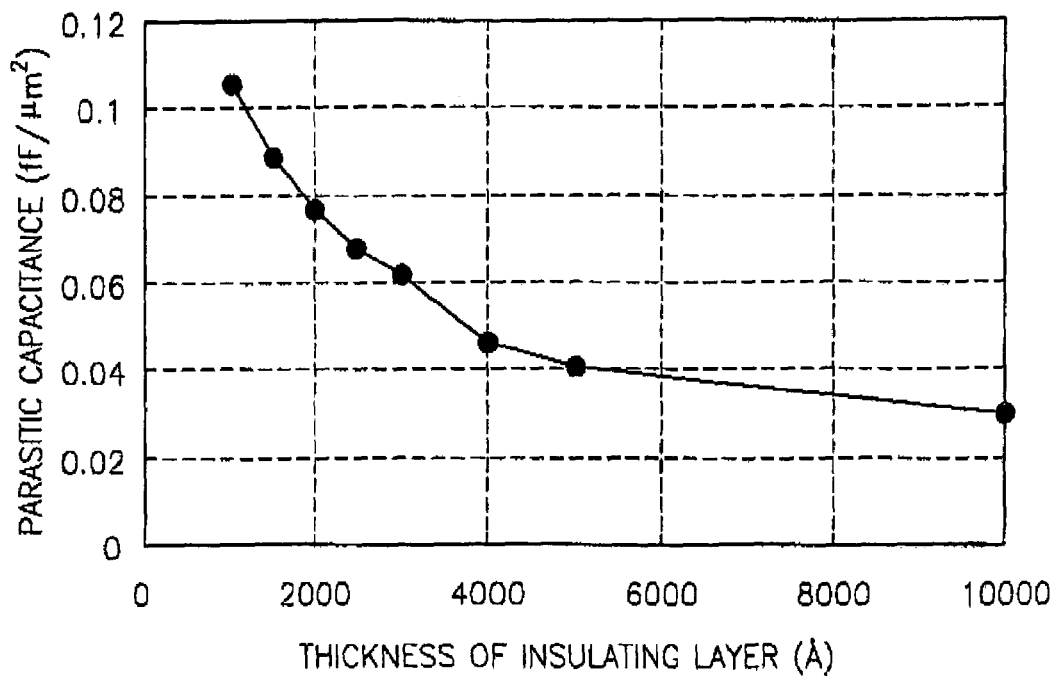
FIG. 2 is a graph illustrating the results of a simulation of parasitic capacitance for different thicknesses of an insulating layer for an integrated circuit device including MIM capacitors according to the prior art.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes and shapes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Terms used herein are to be given their ordinary meaning unless explicitly defined otherwise herein.

Figure 3:
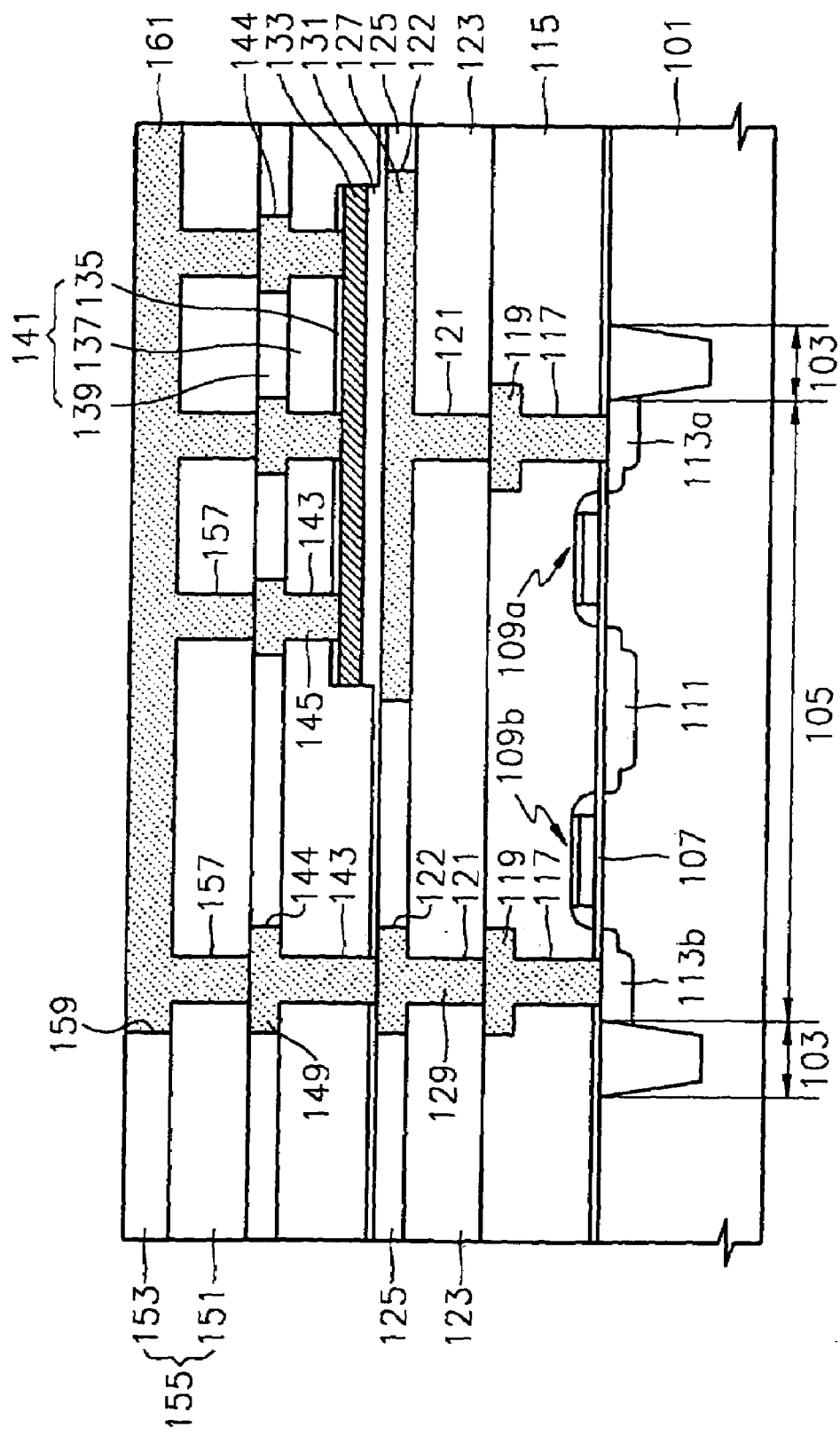
FIG. 3 is a cross-sectional diagram illustrating an integrated circuit device including a capacitor according to some embodiments of the present invention.

Integrated circuit devices and methods for forming such devices in accordance with embodiments of the present invention will now be described with reference to FIGS. 3–10. FIG. 3 is a cross-sectional diagram illustrating an integrated circuit (semiconductor) device including a MIM capacitor according to some embodiments of the present invention. As shown in FIG. 3, the integrated circuit device includes a trench isolation region 103 and an active region 105 formed in an integrated circuit substrate 101. The integrated circuit substrate 101 may be, for example, a silicon substrate.

The active region 105 includes a pair of transistors having a common source region. A first transistor includes a gate 109a, a source 111, a drain 113a and a gate insulating layer 107. The source 111 and drain 113a may be impurity regions formed, for example, by implanting impurity ions in the integrated circuit substrate 101. The second transistor includes a gate 109b, a drain 113b, the source 111 and the gate insulating layer 107.

A conductive pattern 119 defines contacts to the respective drains 113a, 113b via contact holes 117 in a first insulating layer 115. A second insulating layer 123 and a third insulating layer 125 are formed on the conductive pattern 119 and first insulating layer 115. First via holes 121 and a first trench 122 are formed in the second insulating layer 123 and the third insulating layer 125. A lower electrode 127 of a MIM capacitor is formed in the second insulating layer 123 and the third insulating layer 125. The lower electrode 127 is coupled to the drain 113a through the lower electrode 127 and conductive pattern 119 formed on via hole 121, the trench 122 and the contact hole 117. For the embodiments illustrated in FIG. 3, where only one of the transistors is coupled to a capacitor, a first interconnection layer 129 is formed in the second insulating layer 123 and the third insulating layer 125 to provide a contact to the drain 113b through the conductive pattern 119 and the first interconnection layer 129 formed on the first trench 122, the first via hole 121 and the contact hole 117. However, it is to be understood that, in alternative embodiments, a MIM capacitor may be formed coupled to the drain 113b in substantially the same manner as will be described with reference to the MIM capacitor coupled to the drain 113a.

A dielectric layer 131 is positioned between the lower electrode 127 and an upper electrode 133 of the MIM capacitor. An insulating intermetal dielectric layer or first IMD 141 is formed on the upper electrode 133. The first IMD 141 includes a fourth insulating pattern 135, a fifth insulating layer 137, and a sixth insulating layer 139. In various embodiments of the present invention, the total thickness of the first IMD 141 is from about 0.01 micrometers ($\mu$m) to about 2.0 $\mu$m. In further embodiments of the present invention, the total thickness of the first IMD is from about 0.1 $\mu$m to about 0.8 $\mu$m. It is further to be understood that the fourth insulating pattern 135, the fifth insulating layer 137 and the sixth insulating layer 139 may be formed as a single insulating layer. Furthermore, the first IMD 141 may include only the fifth insulating layer 137 and the sixth insulating layer 139 in embodiments of the present invention not including the insulating pattern 135.

Second via holes 143 and second trenches 144 are provided in the first IMD 141 that extend to and at least partially expose the upper electrode 133 of the MIM capacitor and the first interconnection layer 129. A first conductive interconnection layer, shown in FIG. 3 as a landing pad type independent interconnection layer 145, and a second interconnection layer 149 are provided in the second via holes 143 and the second trenches 144.

In particular embodiments of the present invention, a plurality of second trenches 144 and a plurality of second via holes 143 are formed on the MIM capacitor and extending to the upper electrode 133. The landing pad type independent interconnection layer 145 in the first IMD 141 thereby provides a plurality of contacts to the upper electrode 133. In various embodiments of the present invention, the width of the landing pad type independent interconnection layer 145 may be equal to or less than that of the lower electrode 127 of the MIM capacitor, for example, 200 $\mu$m or less. As shown in FIG. 3, the landing pad type independent interconnection layer 145 may also have an upper width greater than its lower width. Furthermore, as shown in the embodiments of FIG. 3 where a plurality of second trenches 144 and second via holes 143 are provided on the upper electrode 133, the landing pad type independent interconnection layer 145 may include a plurality of interconnections which are separated from each other.

As further illustrated in FIG. 3, a further insulating intermetal dielectric layer or second IMD 155 is formed on the landing pad type independent interconnection layer 145, the second interconnection layer 149 and the first IMD 141. The second IMD 155 includes a seventh insulating layer 151 and an eighth insulating layer 153. In some embodiments of the present invention, the total thickness of the second IMD 155 is from about 0.01 µm to about 2.0 µm. In further embodiments of the present invention, the total thickness of the second IMD 155 is from about 0.1 µm to about 0.8 µm. The seventh and eighth insulating layers 151 and 153 may be formed as a single layer or a multiple layer.

A third via hole 157 in the second IMD 155 extends to the first IMD 141 and at least partially exposes the landing pad type independent interconnection layer 145 and the second interconnection layer 149. In addition, a third trench 159 for forming a third interconnection layer 161 are formed in the second IMD 155. For the embodiments illustrated in FIG. 3, a plurality of third via holes 157 are formed in the second IMD 155 over the upper electrode 133 and the landing pad type independent interconnection layer 145. The third interconnection layer 161 is formed in the third via holes 157 and the third trench 159. The third interconnection layer 161, in particular embodiments of the present invention, provides power to the upper electrode 133 of the MIM capacitor.

For the embodiments illustrated in FIG. 3, the landing pad type independent interconnection layer 145 is used as a contact plug that connects the upper electrode 133 of the MIM capacitor with the third interconnection layer 161. Thus, a thick insulating layer, as compared to the conventional device of FIG. 1, including the first and second IMDs 141 and 155, is disposed between the lower electrode 131 of the MIM capacitor and the third interconnection layer 161. As a result, more stable capacitance characteristics may be provided for the MIM capacitor.

Figure 4:
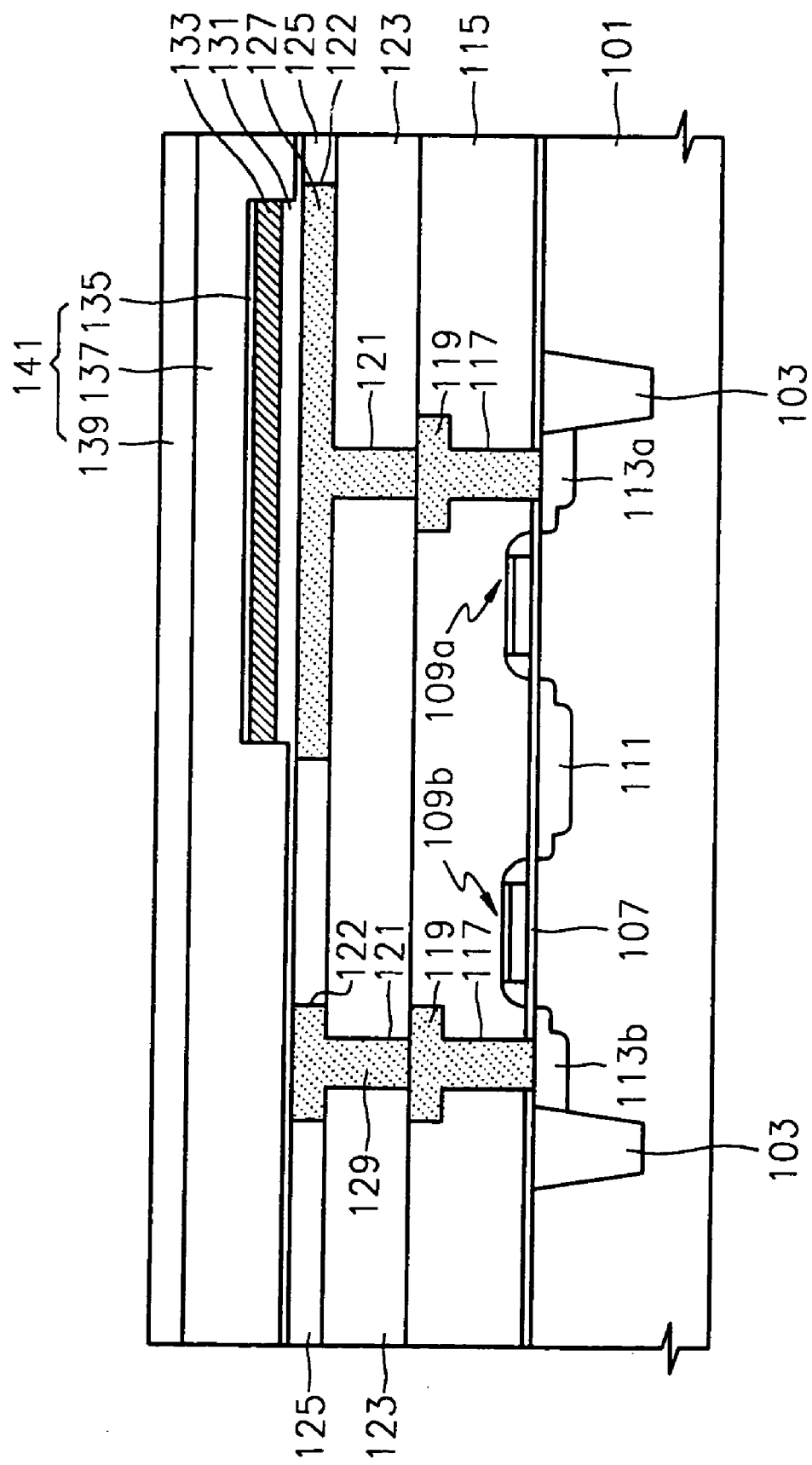
FIGS. 4 through 10 are cross-sectional diagrams illustrating manufacturing of the device of FIG. 3 according to some embodiments of the present invention.

Methods for manufacturing the integrated circuit device of FIG. 3 according to embodiments of the present invention will now be described with reference to the cross-sectional diagrams of FIGS. 4 through 10. Referring first to FIG. 4, a trench isolation region 103 is formed in an integrated circuit substrate 101, such as a silicon substrate, for example, using a shallow trench isolation (STI) technique. A gate insulating layer 107 is formed on the integrated circuit substrate 101. A first gate 109a and a second gate 109b are formed on the gate insulating layer 107. The gates 109a, 109b may be, as illustrated in FIG. 4, a multiple layer formed, for example, of a polysilicon layer and a silicide layer formed thereon. A common source 111 and respective drain 113a, 113b are formed adjacent the gates 109a, 109b using, for example, an ion implantation process.

A first insulating layer 115 is formed on the integrated circuit substrate 101 in the region where the gates 109a, 109b, the source 111 and the drains 113a, 113b are formed. The first insulating layer 115 may be formed, for example, of one of a plasma enhanced (PE) oxide layer, a high density plasma (HDP) oxide layer, a plasma enhanced TEOS (PE-TEOS) oxide layer, a high temperature oxide (HTO) layer, a BPSG layer, a flowable oxide (FOX) layer and/or a combination thereof. The first insulating layer 115 may be formed to a thickness of about 0.01 µm to about 2 µm. In particular embodiments of the present invention, the first insulating layer 115 is formed to a thickness of about 0.4 µm to about 1.0 µm.

A contact hole 117 to each drain 113a, 113b is formed in the first insulating layer 115 using, for example, a photolithographic process. A conductive layer may then be formed on the entire surface of the integrated circuit substrate 101 in the region where the contact hole(s) 117 are formed. A conductive pattern 119 is formed to contact the respective drains 113a, 113b via the contact hole(s) 117, for example, using ordinary photolithographic and/or etching processes.

A second insulating layer 123 and a third insulating layer 125 are sequentially formed on the surface of the integrated circuit substrate 101 in the region where the conductive pattern 119 is formed. The second and third insulating layers 123 and 125 may be formed of oxide layers or other suitable insulating layers, such as a fluorine-doped silicate glass (FSG) layer, an organo silicate glass (OSG) layer and/or an inorganic polymer layer. The second and third insulating layers 123 and 125 may be formed using, for example, chemical vapor deposition (CVD), physical vapor deposition (PVD), atomic layer deposition (ALD), or spin coating. The second and third insulating layers 123 and 125 may be formed to a thickness of about 0.01 µm to about 2 µm and, for some embodiments of the present invention, to about 0.3 µm to about 0.8 µm.

A lower electrode 127 and a first interconnection layer 129 may be simultaneously formed in first via hole(s) 121 and first trenches 122 formed in the second and third insulating layers 123 and 125, for example, using a dual damascene process. The dual damascene process is generally classified into a "via first" type dual damascene process and a "trench first" type dual damascene process.

The "via first" dual damascene type process generally includes forming the first via hole(s) 121 in the second and third insulating layers 123 and 125 and then forming the first trench(es) 122 in the third insulating layer 125. In contrast, the "trench first" dual damascene type process generally includes forming the first trench(es) 122 in the third insulating layer 125 and then forming the first via hole(s) 121 in the second insulating layer 123. A conductive layer for the first interconnection layer 129 and the lower electrode 127 of the MIM capacitor is then deposited on the surface of the semiconductor substrate 101 so as to fill the first via hole(s) 121 and first trench(es) 122. The entire deposited conductive layer, except for the portion filling the first via hole(s) 121 and the first trench(es) 122 is then removed using a conventional chemical mechanical planarization or polishing (CMP). As a result, the lower electrode 127 of the MIM capacitor and the first interconnection layer 129 may be simultaneously formed.

The lower electrode 127 of the MIM capacitor and the first interconnection layer 129 may be formed using known methods other than the dual damascene process described above. For example, after the first via hole(s) 121 are formed, a contact plug may be formed to fill the first via hole(s) 121. The first trench(es) 122 may then be formed and a conductive layer may be deposited to form the first interconnection layer and the lower electrode. The conductive layer may then be polished using, for example, chemical mechanical planarization or polishing(CMP).

The second and third insulating layers 123 and 125 may be either a single layer or a multiple layer as illustrated in FIG. 4. The second and third insulating layers 123 and 125 may be formed using a single step or a multiple step fabrication process. The first trench(es) 122 may be formed in the third insulating layer 125 and/or the first trench(es) 122 may penetrate into the second insulating layer 123.

The conductive layer used for the lower electrode 127 of the MIM capacitor and/or the first interconnection layer 129 may be formed of a metal such as copper (Cu), aluminium (Al), titanium (Ti), tantalum (Ta), titanium nitride (TiN), tantalum nitride (TaN), tantalum silicon nitride (TaSiN), titanium silicon nitride (TiSiN), tungsten nitride (WN) or tungsten silicon nitride (WSiN). The conductive layer used for the lower electrode 127 and/or the first interconnection layer 129 may be formed, for example, using CVD, PVD or electroplating. The conductive layer used for the lower electrode 127 and/or the first interconnection layer 129 may be formed to a thickness of about 0.001 μm to about 2 μm and, for particular embodiments of the present invention, to a thickness of about 0.05 μm to about 0.8 μm.

A dielectric pattern 131, an upper electrode 133 of the MIM capacitor and a fourth insulating pattern 135 are sequentially formed on the integrated circuit substrate 101 in the region where the lower electrode 127 is formed. The dielectric pattern 131 provides the a dielectric layer of the MIM capacitor and is sequentially formed with a conductive layer for the upper electrode 133 and a fourth insulating layer for the fourth insulating pattern 135 on the lower electrode 127, the third insulating layer 125 and the first interconnection layer 129. The sequentially formed layers are patterned using, for example, photolithographic and etching processes, to complete formation of the dielectric pattern 131, the upper electrode 133 and the fourth insulating pattern 135.

The patterning process may be performed so that the thickness of the remaining dielectric pattern 131 is about 0.001 μm to about 1 μm and, for particular embodiments of the present invention, a thickness of about 0.01 μm to about 0.1 μm. Such a thickness range may reduce and/or minimize out diffusion of the material used for the lower electrode 127.

As a result of the processes described with reference to FIG. 4, a MIM capacitor including the lower electrode 127, the dielectric pattern 131 and the upper electrode 133 is formed on the integrated circuit substrate 101.

The dielectric pattern 131 may be, for example, a nitride layer, an oxide layer, a silicon carbide (SiC) layer, a silicon oxynitride (SiON) layer, a silicon carbnitride (SiCN) layer, a silicon oxyfluoride (SiOF) layer, a silicon carbohydride (SiOH) layer, a hafnium oxide ($HfO_2$) layer and/or an aluminum oxide ($Al_2O_3$) layer. The dielectric pattern 131 may be formed using a process such as CVD, PVD, or ALD. In some embodiments of the present invention, the dielectric pattern 131 is formed to a thickness of about 0.001 μm to about 1 μm. In other embodiments, the dielectric pattern 131 is formed to a thickness of about 0.01 μm to about 0.5 μm.

The upper electrode 133 is formed of a conductive layer. The conductive layer of the upper electrode maybe formed, for example, of a metal such as copper (Cu), tantalum nitride (TaN), aluminum (Al), titanium (Ti), tantalum (Ta), titanium nitride (TiN), tantalum silicon nitride (TaSiN), titanium silicon nitride (TiSiN), tungsten nitride (WN) and/or tungsten silicon nitride (WSiN) using, for example, CVD, PVD and/or electroplating. The conductive layer of the upper electrode may be formed to a thickness of about 0.001 μm to about 2 μm and, in particular embodiments, to a thickness of about 0.05 μm to about 0.8 μm.

The fourth insulating pattern 135 may be formed of an oxide layer, a nitride layer and other insulating layers, such as an FSG layer, an OSG layer and/or an SiC layer (or a combination thereof) using, for example, CVD, PVD, or ALD. The fourth insulating pattern 135 may be formed to a thickness of about 0.001 μm to about 1 μm and, in particular embodiments, to a thickness of about 0.01 μm to about 0.5 μm. The fourth insulating pattern 135 may be used to suppress generation of a polymer during a subsequent etching process (such as forming a contact).

A fifth insulating layer 137 and a sixth insulating layer 139 are formed on the surface of the integrated circuit substrate 101 in the region where the MIM capacitor is formed. As a result, a first IMD 141 including the fourth insulating pattern 135, the fifth insulating layer 137 and the sixth insulating layer 139 is formed on the upper electrode 133 and on the first interconnection layer 129. The fifth and sixth insulating layers 137 and 139 may be formed of an oxide layer, an SiC layer, an SiON layer, an SiCN layer, an SiOF layer, an SiOH layer, an $HfO_2$ layer, a zirconium oxide ($ZrO_2$) layer and/or an $Al_2O_3$ layer using, for example, CVD, PVD, or ALD. The fifth and sixth insulating layers 137 and 139 may be formed to a thickness of about 0.1 μm to about 2 μm and, in particular embodiments, to a thickness of about 0.3 μm to about 0.8 μm. The fifth and sixth insulating layers 137 and 139 may be formed as a single layer or as multiple layers through a plurality of steps or in a single step.

Figure 5:
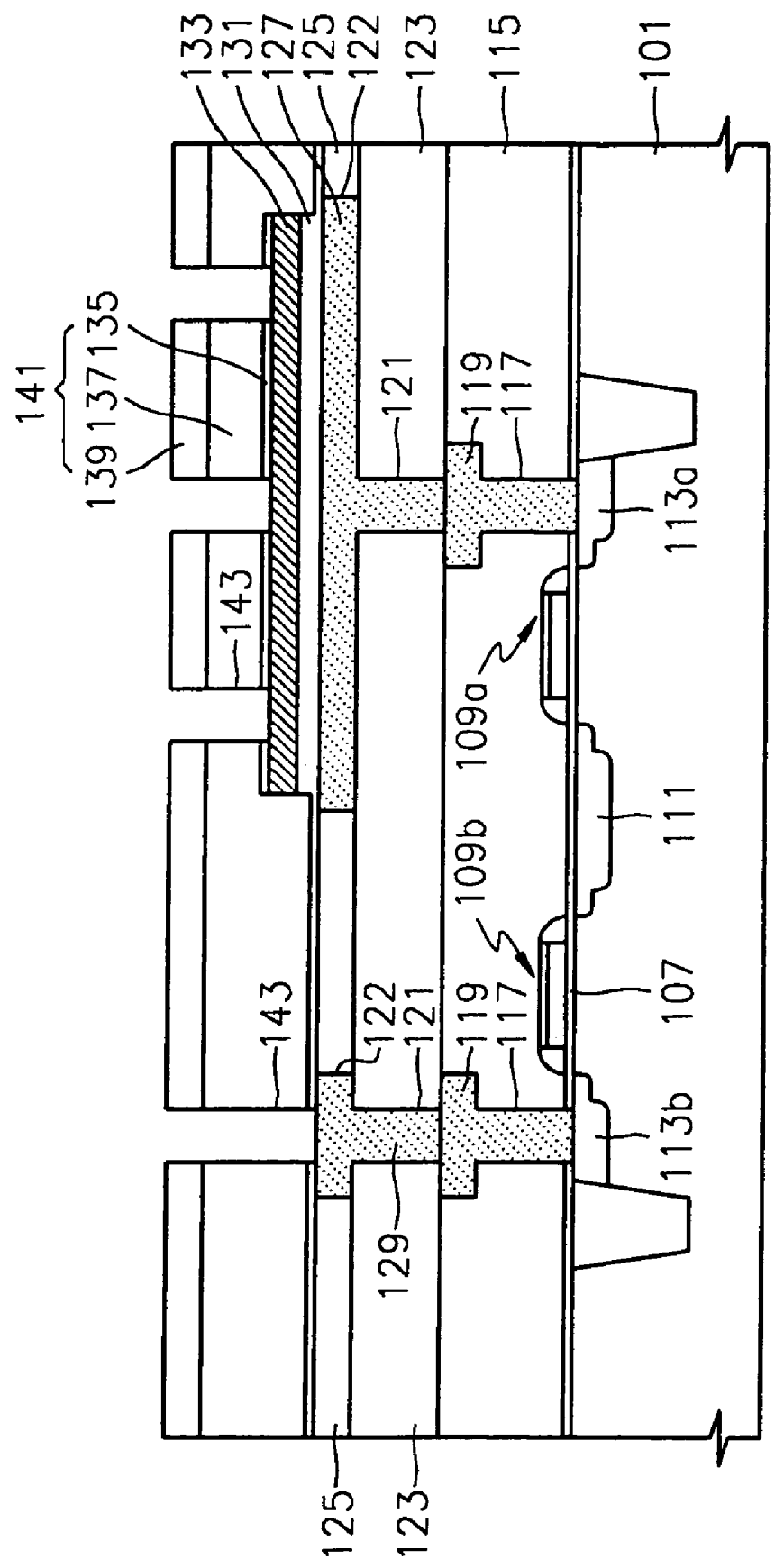
Figure 6:
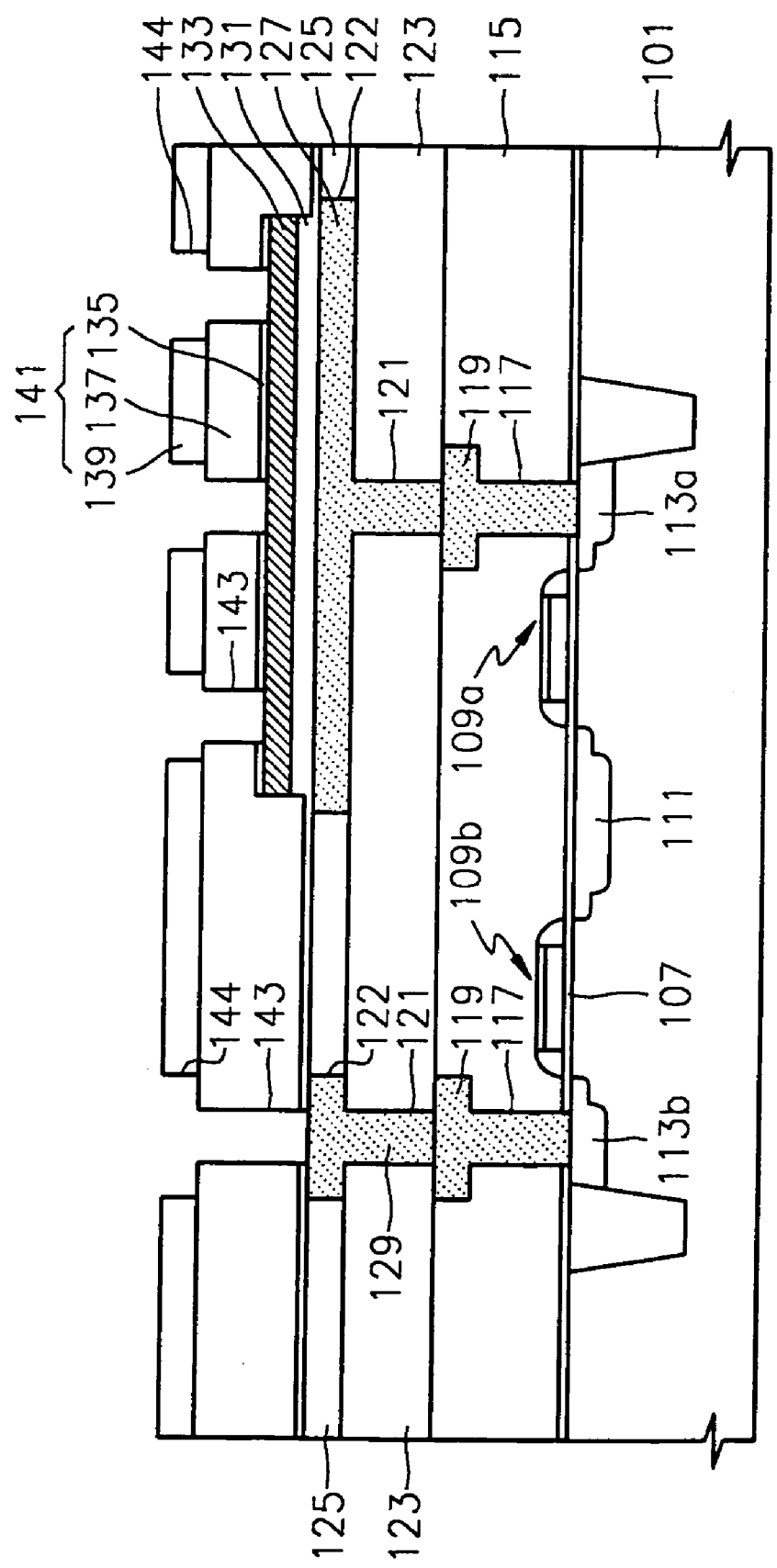
Figure 7:
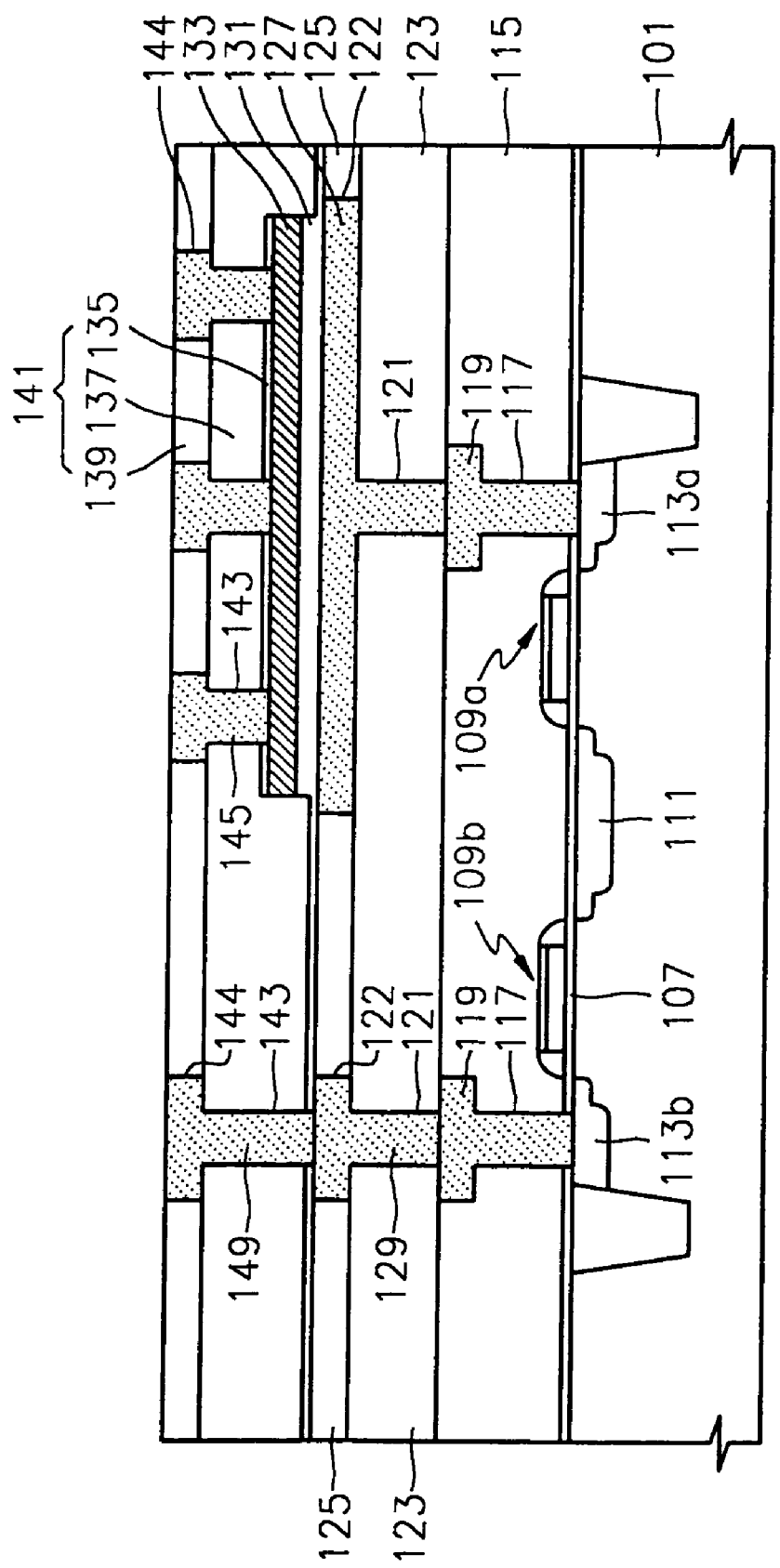

Referring now to FIGS. 5 through 7, a second via hole 143, a second trench 144, a landing pad type independent interconnection layer 145, and a second interconnection layer 149 are formed, for example, using the dual damascene process as described above. However, the second via hole 143, the second trench 144, the landing pad type independent interconnection layer 145 and the second interconnection layer 149 may be formed using other known methods as an alternative to the dual damascene process. For example, after the fifth insulating layer 137 is formed, the second via hole 143 may be formed. A contact plug may then be formed to fill the second via hole 143. The sixth insulating layer 139 and the second trench 144 may then be formed. A metal layer for the second interconnection layer 149 and to complete the landing pad type independent interconnection layer 145 may then be deposited. Finally, the metal layer may be polished using, for example, CMP.

FIGS. 5 through 7 particularly illustrate a method of forming the second via hole 143, the second trench 144, the landing pad type independent interconnection layer 145 and the second interconnection layer 149 using the "via first" dual damascene process. The second via hole 143, the second trench 144, the landing pad type independent interconnection layer 145 and the second interconnection layer 149 may also be formed using the "trench first" dual damascene process.

As shown in FIG. 5, the sixth insulating layer 139, the fifth insulating layer 137 and the fourth insulating pattern 135, which constitute the first IMD 141, are patterned using photolithographic and etching processes to form the second via hole(s) 143. The second via hole(s) 143 expose the upper electrode 133 of the MIM capacitor as well as the first interconnection layer 129.

As shown in FIG. 6, a portion of the first IMD 141 formed on the MIM capacitor, i.e. the sixth insulating layer 139, is selectively etched using, for example, photolithographic and etching processes, to form second trench(es) 144 in the region where the second interconnection layer 149 and the landing pad type independent interconnection layer 145 will be formed. The second trench(es) 144 in the region where the landing pad type independent interconnection layer 145 will be formed are formed in the first IMD 141 formed on the MIM capacitor, i.e. the sixth insulating layer 139. The second trench(es) 144, as illustrated in FIG. 6, have a greater diameter than a diameter of the second via hole(s) 143.

Referring now to FIG. 7, the landing pad type independent interconnection layer 145 and second interconnection layer 149 are formed to fill the second via hole(s) 143 and second trench(es) 144. The landing pad type independent interconnection layer 145 is formed in the second via hole(s) 143 and second trench(es) 144.

In some embodiments of the present invention, forming of the landing pad type independent interconnection layer 145 includes forming a conductive layer on the entire surface of the integrated circuit substrate 101 to fill the second via hole(s) 143 and the second trench(es) 144. The conductive layer is then planarized using, for example, CMP. As a result, the top surfaces of the landing pad type independent interconnection layer 145 and the second interconnection layer 149 may be formed to the same height as the sixth insulating layer 139. The width of the landing pad type independent interconnection layer 145 in some embodiments of the present invention is less than that of the lower electrode 127 of the MIM capacitor, for example, 200 µm or less. The width at the top of the landing pad type independent interconnection layer 145 may be greater than that at the bottom thereof. The landing pad type independent interconnection layer 145 may be formed of a plurality of interconnection layers in via holes and trenches that are separated from each other.

The landing pad type independent interconnection layer 145 and the second interconnection layer 149 may be formed of copper (Cu), aluminium (Al), titanium (Ti), tantalum (Ta), titanium nitride (TiN), tantalum nitride (TaN), tantalum silicon nitride (TaSiN), titanium silicon nitride (TiSiN), tungsten nitride (WN) and/or tungsten silicon nitride (WSiN) and may be formed using, for example, CVD, PVD or electroplating. The landing pad type independent interconnection layer 145 and the second interconnection layer 149 may be formed to a thickness of about 0.1 µm to about 2 µm and, in particular embodiments, to a thickness of about 0.05 µm to about 0.8 µm.

Figure 8:
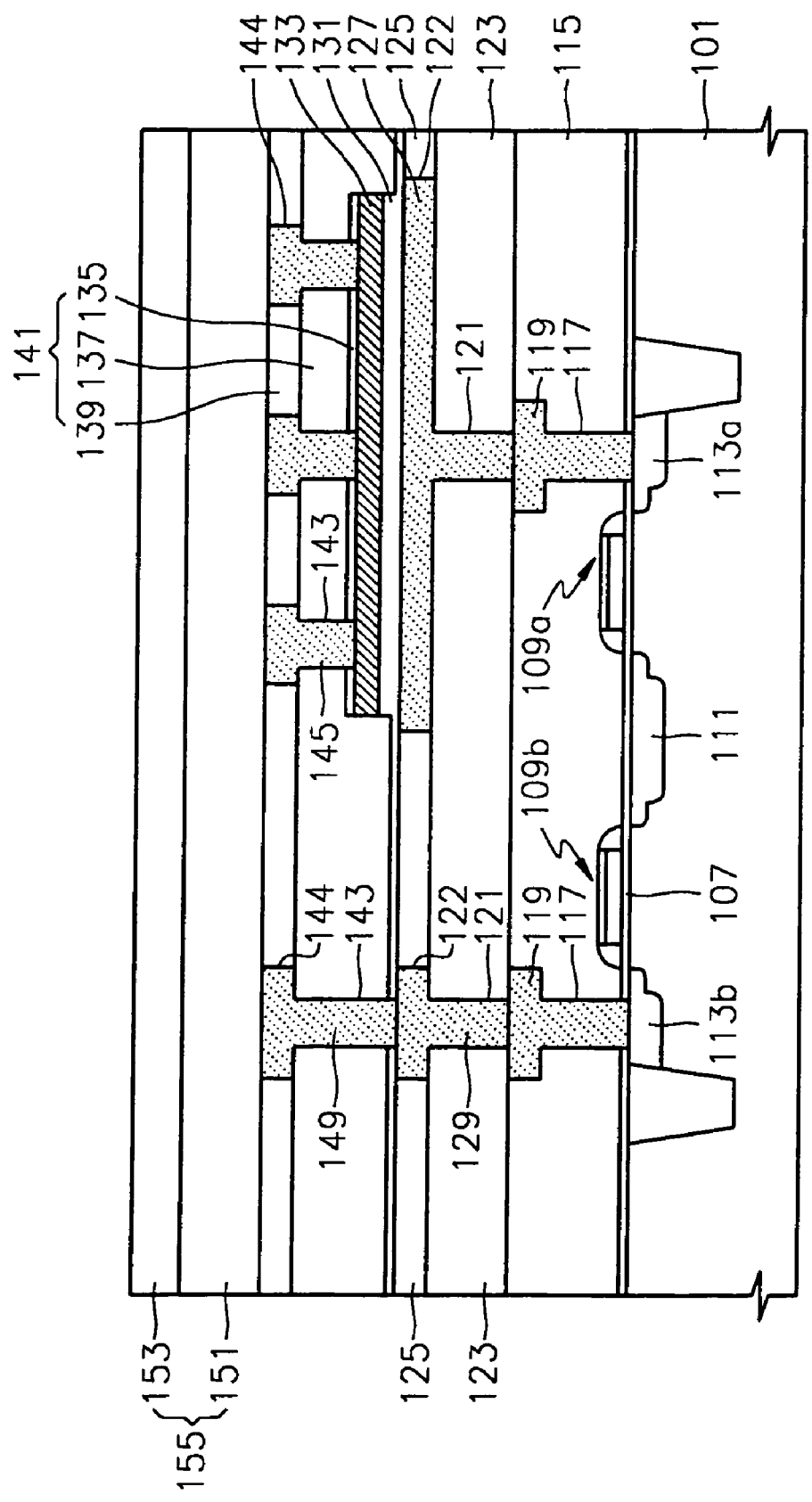

As shown in FIG. 8, a seventh insulating layer 151 and an eighth insulating layer 153, which constitute the second IMD 155, are formed on the surface of the semiconductor substrate 101 in the region where the MIM capacitor is formed. In other words, the seventh insulating layer 151 and the eighth insulating layer 153 are formed on the landing pad type independent interconnection layer 145 and the first IMD 141. The second IMD 155 may be formed through a single step process or using a plurality of steps and may be formed as a single layer or a multiple layer structure including subsequent layers.

The seventh and eighth insulating layers 151 and 153 may be formed of oxide layers or other insulating layers such as a SiC layer, a SiON layer, a SiCN layer, a SiOF layer, a SiOH layer, a HfO2 layer, a ZrO2 layer, or an AL2O3 layer. The seventh and eight insulating layers 151 and 153 may be formed using, for example, CVD, PVD, or ALD. The seventh and eight insulating layers 151 and 153 may be formed to a thickness of about 0.001 µm to about 1 µm and, in particular embodiments, to a thickness of about 0.01 µm to about 0.1 µm. Alternatively, the seventh and eighth insulating layers 151 and 153 may be formed of oxide layers or other insulating layers such as an FSG layer, an OSG layer and/or an inorganic polymer layer using, for example, CVD or spin coating. The seventh and eighth insulating layers 151 and 153 in such embodiments may be formed to a thickness of about 0.01 µm to about 2 µm and, in particular embodiments, to a thickness of about 0.1 µm to about 0.8 µm.

Figure 10:
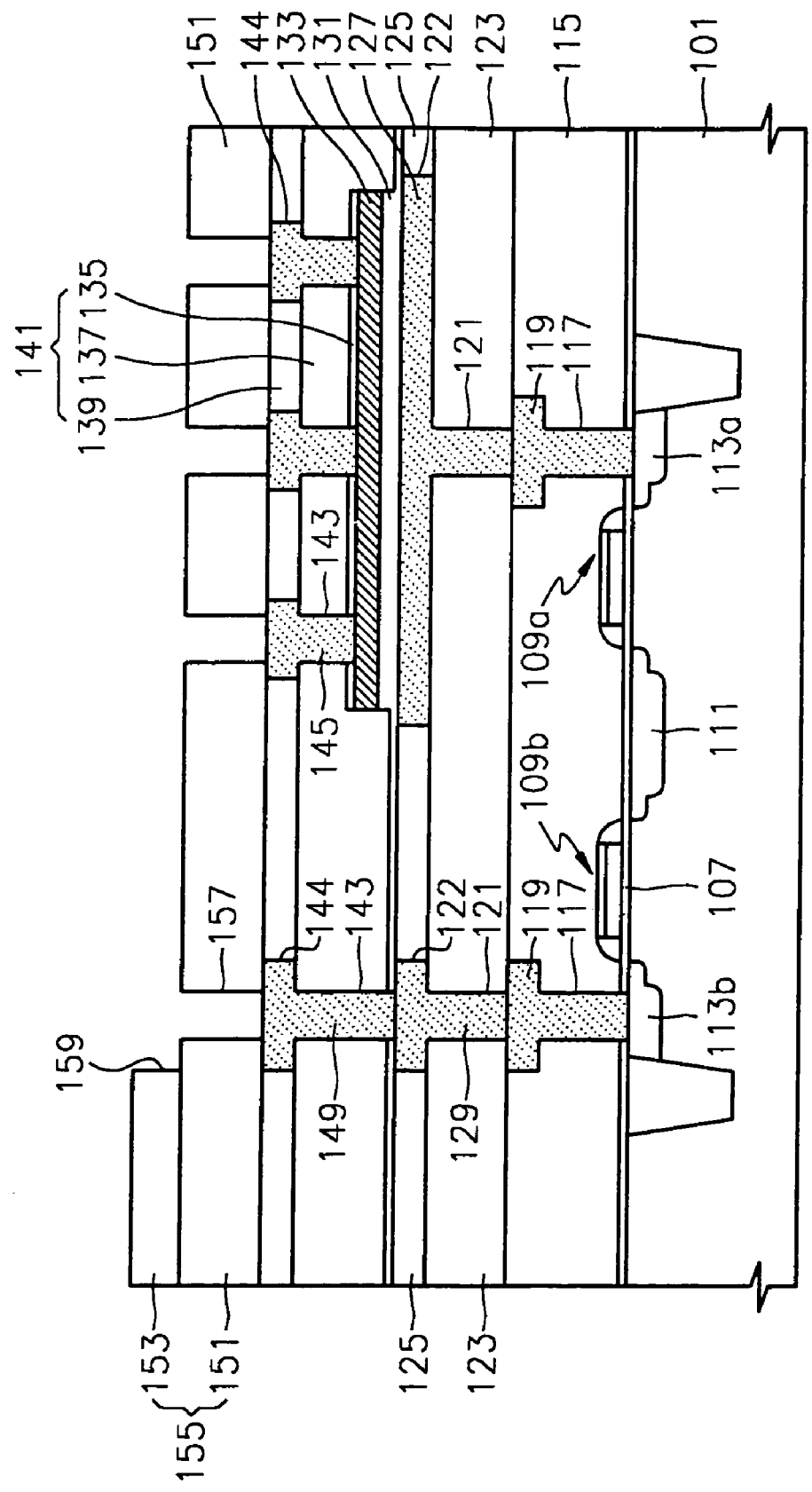

As seen in FIG. 10, third via hole(s) 157, third trench(es) 159 and a third interconnection layer 161 (see FIG. 3) are formed, for example, using the dual damascene process. The third via hole(s) 157, the third trench(es) 153 and the third interconnection layer 161 may also be formed using known methods other than the dual damascene process. For example, after the seventh insulating layer 151 is formed, the third via hole(s) 157 may be formed. A contact plug may then be formed to fill the third via hole(s) 157. The eighth insulating layer 153 and the third trench(es) 159 may then be formed. A metal layer for the third interconnection layer may then be deposited. Finally, the metal layer may be polished, for example, using CMP.

Figure 9:
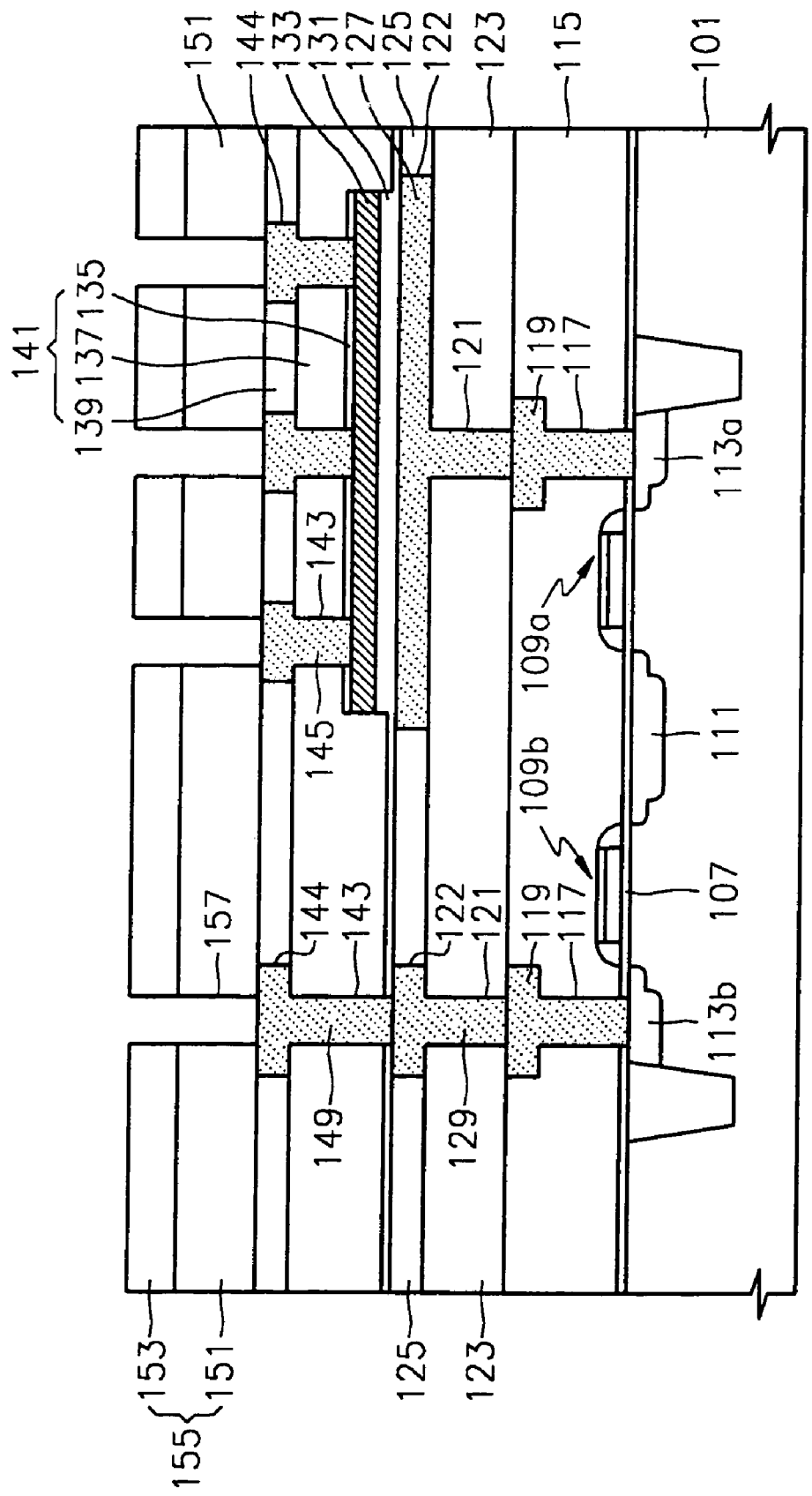

FIGS. 9 and 10 particularly illustrate a method of forming the third via hole 157, the third trench 159 and the third interconnection layer 161 using the "via first" dual damascene process. However, as noted above, it is also possible to form the third via hole(s) 157, the third trench(es) 159 and the third interconnection layer 161 using the "trench first" dual damascene process or other processes. As shown in FIG. 9, the seventh and eight insulating layers, which constitute the second IMD 155, are patterned using, for example, photolithographic and etching processes, to form the third via hole(s) 157. The third via hole(s) 157 expose the landing pad type independent interconnection layer 145 and the second interconnection layer 149.

Referring now to FIG. 10, a portion of the second IMD 155, for example, the eighth insulating layer 153, is selectively etched, for example, using photolithographic and etching processes, to form the third trench(es) 159 in the region where the third interconnection layer 161 will be formed. The third trench 159 is formed in the second IMD 155, for example, in the eighth insulating layer 153, and has a greater diameter than the third via hole(s) 157.

As illustrated in FIG. 3, the third interconnection layer 161 is filled into the third via hole(s) 157 and the third trench(es) 159. Forming of the third interconnection layer 161 may include forming a conductive layer on the entire surface of the semiconductor substrate 101 to fill the third via hole(s) 157 and the third trench(es) 159, followed by planarizing the conductive layer using, for example, CMP. As a result, the top surface of the third interconnection layer 161 may be formed to the same height as that of the eighth insulating layer 153 in the region including the second IMD 155. In some embodiments of the present invention, as illustrated in FIG. 10, a plurality of third via holes 157 are provided through which the third interconnection layer 161 contacts the landing pad type independent interconnection layer 145.

The third interconnection layer 161 may be formed of a metal such as copper (Cu), aluminium (Al), titanium (Ti), tantalum (Ta), titanium nitride (TiN), tantalum nitride (TaN), tantalum silicon nitride (TaSiN), titanium silicon nitride (TiSiN), tungsten nitride (WN) and/or tungsten silicon nitride (WsiN) using, for example, CVD, PVD or electroplating. The third interconnection layer 161 may be formed to a thickness of about 0.01 µm to about 2 µm and, for particular embodiments, to a thickness of about 0.1 µm to about 0.8 µm.

While the embodiments of the present invention have been described with reference to a method of forming interconnections using the dual damascene process, the method should not be limited to the embodiments set forth herein and interconnections may also be formed using typical photolithographic and etching processes. Further, it is also possible to omit the step of forming the second via hole and form the second via hole by simultaneously etching the first and second IMDs during the step of forming the third via hole. In addition, while the present invention has been described with reference to a MIM capacitor coupled to a transistor drain sharing a common source with another transistor drain that is not coupled to a capacitor, the present invention also includes embodiments in which each drain is coupled to a capacitor or in which only a single drain is provided without an associated drain of a transistor sharing a common source. Moreover, while the present invention has generally been described above with no diffusion barrier layers and/or adhesion layers under and/or on the metal layers, diffusion barrier layers and/or adhesion layers can be used to reduce or prevent diffusion of atoms used for forming metal layers and to enhance adhesion of metal layers.

As described above, according to some embodiments of the present invention, the upper electrode of a MIM capacitor is connected to an upper interconnection layer via a landing pad type independent interconnection layer allowing for a thicker IMD layer. Such a structure may limit the adverse affect of parasitic capacitance on the characteristics of the MIM capacitor. As a result, MIM capacitors with stable characteristics may be obtained.

It should be noted that many variations and modifications may be made to the embodiments described above without substantially departing from the principles of the present invention. All such variations and modifications are intended to be included herein within the scope of the present invention, as set forth in the following claims.

We claim:

1. An integrated circuit device comprising:
an integrated circuit substrate;
a conductive lower electrode layer of a capacitor on the integrated circuit substrate;
a dielectric layer on the lower electrode layer;
a conductive upper electrode layer of the capacitor on the dielectric layer;
a first intermetal dielectric layer on the upper electrode layer, the first intermetal dielectric layer including at least one via hole extending to the upper electrode layer;
a first conductive interconnection layer on the at least one via hole of the first intermetal dielectric layer;
a second intermetal dielectric layer on the first intermetal dielectric layer, the second intermetal dielectric layer including at least one via hole extending to the first conductive interconnection layer and at least partially exposing the at least one via hole of the first intermetal dielectric layer; and
a second conductive interconnection layer on the at least one via hole of the second intermetal dielectric layer that electrically contacts the first conductive interconnection layer.

2. The device of claim 1 wherein the first conductive interconnection layer comprises a landing pad type independent interconnection layer that connects the second conductive interconnection layer to the upper electrode.

3. The device of claim 1 wherein the dielectric layer has a thickness between the lower electrode layer and the upper electrode layer greater than the thickness of the dielectric layer in other regions of the device.

4. The device of claim 1 wherein the first intermetal dielectric layer further comprises an insulating pattern formed only on the upper electrode.

5. The device of claim 1 wherein the at least one via hole of the first intermetal dielectric layer comprises a plurality of via holes separated from each other.

6. The device of claim 2 wherein the landing pad type interconnection layer is formed to the same height as the first intermetal dielectric layer.

7. The device of claim 2 wherein the landing pad type interconnection layer comprises a plurality of interconnections separated from each other.

8. The device of claim 1 wherein the first intermetal dielectric layer further comprises a trench formed with a greater diameter than that of the first via hole and to a smaller depth than that of the first via hole.

* * * * *